United States Patent [19]

Tanii et al.

[11] Patent Number: 4,687,266
[45] Date of Patent: Aug. 18, 1987

[54] ELECTRICAL CONNECTING TERMINAL

[75] Inventors: Junichi Tanii; Toshio Yamaki; Kiyoshi Seigenji, all of Osaka, Japan

[73] Assignee: Minolta Camera Kabushiki Kaisha, Japan

[21] Appl. No.: 763,738

[22] Filed: Aug. 8, 1985

[30] Foreign Application Priority Data

Aug. 11, 1984 [JP] Japan .................... 59-123362[U]

[51] Int. Cl.⁴ ............................................. H05K 1/00
[52] U.S. Cl. ........................................ 439/77; 29/831; 439/271; 439/876
[58] Field of Search ............... 339/275 R, 17 R, 17 C, 339/17 LC, 17 F, 94, 126 RS, 59 R, 59 M, 17 CF; 174/386; 361/403, 418; 29/831, 837

[56] References Cited

U.S. PATENT DOCUMENTS

| | | | |
|---|---|---|---|
| 2,524,939 | 10/1950 | Stephan et al. | 339/126 RS |
| 3,993,382 | 11/1976 | Brown | 339/17 LC |
| 4,113,981 | 9/1978 | Fujiti et al. | 339/17 F |
| 4,202,588 | 5/1980 | Dalamangas et al. | 339/59 M |
| 4,310,211 | 1/1982 | Bunnell et al. | 339/94 R |
| 4,410,928 | 10/1983 | Aramaki | 339/17 C |
| 4,429,348 | 1/1984 | Dean | 361/418 |
| 4,449,769 | 5/1984 | Kobayashi et al. | 339/17 C |
| 4,480,289 | 10/1984 | Huffman | 361/403 |
| 4,602,125 | 7/1986 | West et al. | 361/403 |

*Primary Examiner*—Gil Weidenfeld
*Assistant Examiner*—David Pirlot
*Attorney, Agent, or Firm*—Wolder, Gross & Yavner

[57] ABSTRACT

A frame member is bonded on a base plate having a plurality of electrical contacts thereon. The frame member includes a plurality of apertures corresponding to the electrical contacts. Bonding means bonding the frame member on the base plate is formed by a waterproof double faced bonding member including a waterproof sheet and waterproof bonding agent applied to both sides of the sheet, the double faced bonding member separates the electrical contacts from each other to prevent accidental conduction between the adjacent electrical contacts due to a water drop.

13 Claims, 9 Drawing Figures

ELECTRICAL CONNECTING TERMINAL

BACKGROUND OF THE INVENTION

1. Field of the Invention

The present invention relates to an electrical connecting terminal in an electrical device and particularly to a water-proof and humidity-proof electrical connecting terminal which is suited for use in a portable electrical device which may be employed in a high humidity area or in an area exposed to rain.

2. Description of the Prior Art

An example of a conventional electrical connecting terminal as explained above is shown in FIG. 8 of the drawings. Numeral 1 represents a substrate mounted to the main body (not illustrated) of an electrical device. Terminal contacts 2 are arranged on the substrate 1. Numeral 3 represents a frame molded of an electrical insulating material. Frame 3 has apertures 4 corresponding to the terminal contacts and separated by walls 5 between the respective terminal contacts. Connecting pins (not illustrated) of an associated electrical device connected to this terminal are placed in contact with terminal contacts 2 through the apertures 4 of frame 3, establishing an electrical connection between both electrical devices. The frame 3 is affixed to the substrate 1 by screws but in such case if a water drop, for example, adheres to one terminal contact, the water reaches, by capillary action, the adjacent terminal contact through the gap between the lower surface of frame 3 and the surface of substrate 1, degrading the electrical insulation between the terminals. Therefore, the frame 3 and substrate 1 are bonded by a bonding agent supplied between them. But, if an excessive amount of bonding agent is used, the excessive agent oozes from the bonding area when the frame is pressed to the substrate and then adheres to the terminal contacts, interfering with the electrical connection. On the contrary, if the bonding agent is insufficient in amount, a clearance remains between the substrate and the frame and water traverses the area between the terminal contacts, resulting in the deterioration of the insulation characteristic. However, it is very difficult in the manufacturing process to accurately control the amount of bonding agent applied and moreover if it is controlled, there is no guarantee that the bonding agent is supplied around the connecting pins without any clearance. Therefore, reliability in the water-proof and humidity-proof characteristics of the electrical connecting terminals is low and the process of applying the bonding agent is operably lacking and is not suited to a mass-production system.

SUMMARY OF THE INVENTION

With the aforementioned background, the present invention is intended to provide an electrical connecting terminal which assures high reliability in water-proof and humidity-proof characteristics and high adaptability to manufacturing processes.

The above and other objects of the present invention will become more apparent from the following description when taken in conjunction with the accompanying drawings in which preferred embodiments of the present invention are shown by way of illustrative example.

BRIEF DESCRIPTION OF THE DRAWINGS

FIGS. 4a and 4b show a camera employing the electrical connecting terminal shown in FIG. 2 wherein FIG. 4a is a front view of the camera and FIG. 4b is a bottom view of the camera.

DESCRIPTION OF THE PREFERRED EMBODIMENTS

Figure 1:
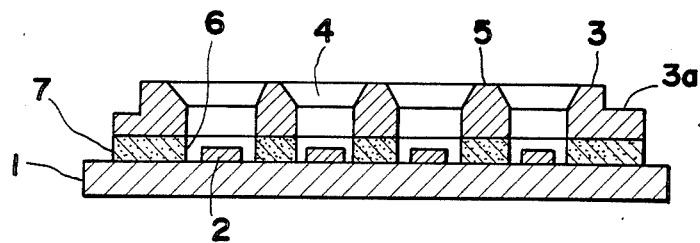
FIG. 1 is a sectional view indicating the basic structure of a connecting terminal of the present invention.
Figure 2:
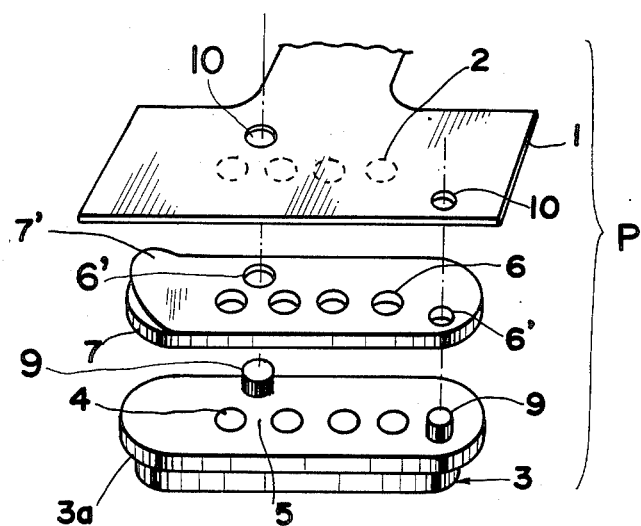
FIG. 2 is an exploded perspective view of an electrical connecting terminal according to an embodiment of the present invention.
Figure 5:
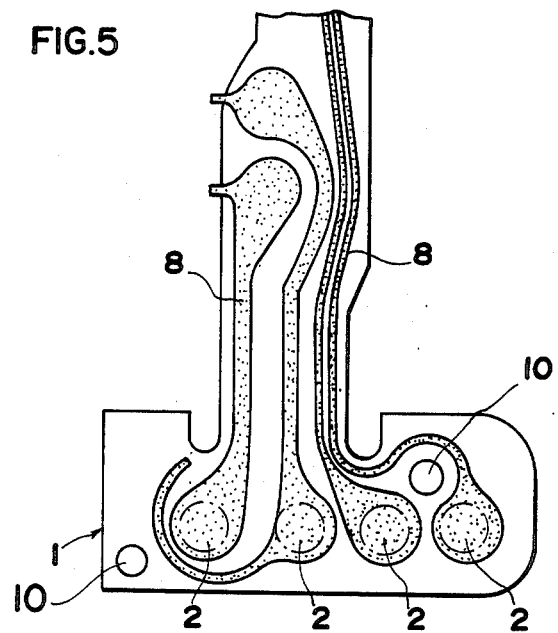
FIG. 5 is a plan view of a terminal substrate of the camera.

Referring to FIGS. 1 and 2 showing an electrical connecting terminal P according to an embodiment of the present invention, a substrate 1 is formed by a flexible printed circuit board having printed wiring patters 8 on the lower surface thereof (see FIG. 5). The end portions of these patterns are formed as terminal contacts 2 of the electrical connecting terminal and these contacts are gold-plated for reducing contact resistance. A frame 3 is made of a molded plastic and is provided with protrusions 9 for positioning frame 3 relative to the substrate. Frame 3 is formed with apertures 4 corresponding to terminal contacts 2 and separation walls 5 between the apertures. A double faced bonding material 7 placed between frame 3 and substrate 1 has a water-proof sheet (described later) the both sides of which are coated with a water-proof bonding agent (described later). This double faced bonding material is die cut under the condition that the both sides are covered by separable separation papers 7'. (Only the separation paper 7' at the upper surface of the bonding material shown in FIG. 2.) The double faced bonding material 7 has an external shape matching that of the frame 3 and is also provided with apertures 6 corresponding to the terminal contacts 2 and apertures 6' corresponding to the protrusions 9. For assembling the electrical connection terminal, the separation paper 7' at the lower side is at first removed or stripped, and then the double faced bonding material 7 is bonded to the frame 3 with the aperture 6' engaging the protrusion 9. Next, the separation paper 7' at the upper surface of material 7 is removed, and the substrate 1 is bonded on the double faced bonding material 7 with holes 10 corresponding to the protrusion 9 of the substrate 1 engaging the protrusion 9. Thereafter the frame 3 and substrate 1 are adequately pressurized whereby the electrical connecting terminal is completed.

As for the double faced bonding material, those obtained by coating a base such as cloth, paper or unwoven fabric, etc. with a rubber bonding agent are commercially available. But these materials are inferior in the water-proof characteristic and are therefore not suited to the present invention. In the case of the present invention, a sheet such as polypropylene or polyester having excellent water-proof characteristic is used as the base. The water-proof characteristic is further improved by utilizing an acrylic and epoxy bonding agent having superior water-proof properties than the rubber agent, as the bonding agent. However, in case polypropylene or polyester is used as the base, a rubber bonding agent may also be used to provide a water-resistant double faced bonding seat member although the waterproof characteristic is a little lowered.

The double faced bonding material is not limited only to those in which both sides of a base are coated with a bonding agent. The double faced bonding material may be a sheet of ethyl-vinyl-alcohol (copolymer of ethylene-acetate vinyl) resin having by itself the property to be bonded to the other material when heated. Where such a sheet is used, the substrate 1 and the frame 3 can be bonded by providing such a sheet between them and then thermally pressurizing them with a press.

Figure 3:
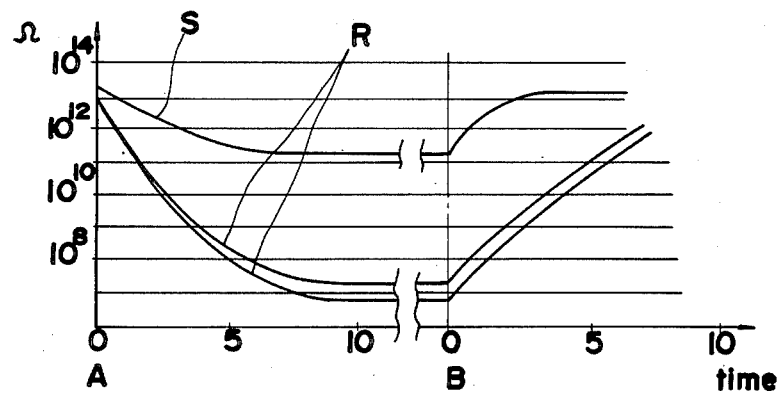
FIG. 3 is a graph showing the results of performance experiments of the same embodiments.

FIG. 3 is a graph showing the water-proof characteristic of the connecting terminal of the present invention. In this figure, the obscissa indicates an insulation resistance between the adjacent two terminal contacts, while the ordinate indicates time. The timing A is the experiment starting point and a drop of water is applied at this time to one of the adjacent two terminal contacts. Therefore, the insulation resistance at this time is the value when the one contact is still dry. The insulation resistance diminishes as time passes. The curve S indicates the characteristic of the connecting terminal of the present invention, while the curves R indicate the results of the experiment for terminals utilizing the double faced bonding tape which is available commercially on the market, as the double faced bonding material. This figure clearly shows the present invention is superior to such tape in the water-proof characteristic. At time B, the water drop on the terminal contact is absorbed. Thereafter the insulation resistance is recovered as the contact is gradually dried and the connecting terminal of the present invention shows quicker recovery.

Figure 4A:
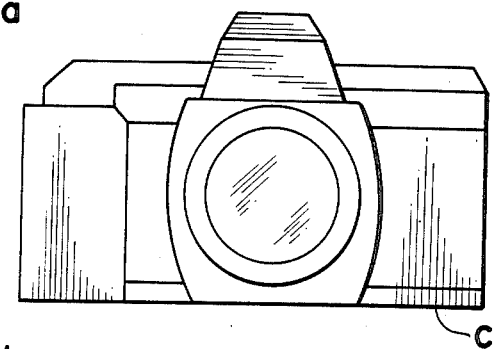
Figure 4B:
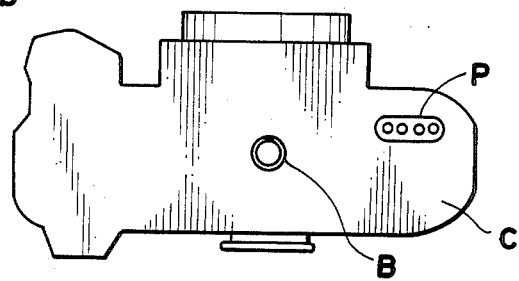

Referring to FIGS. 4a and 4b, a camera is provided, its bottom cover C with an electrical connecting terminal P and a screw hole B for receiving a tripod screw. The screw hole B receives a screw for attaching, to the camera, a power grip provided with an electric flash device and a large capacity battery therefor. Between the power grip and the camera it is necessary to transmit electrical signals for automatic exposure control and automatic flash light quantity control upon flash photography, from one to the other and vice versa. With the power grip attached to the camera by the screw, electrical connection for the signal transmission is established through the connecting terminal.

In FIG. 5 printed patterns 8 on the substrate 1 constitute a part of a control circuit of the camera. The printed patterns 8 are covered with a coverlay, except for those parts which constitute the terminal contacts 2. After the frame 3 is affixed on this substrate with the procedures explained with reference to FIG. 2 the bottom cover C of the camera is then affixed to a camera body to hold a peripheral plate portion 3a of the frame against the lower surface of the camera body, so that the frame, except for the portion 3a, is externally exposed through an opening formed on the bottom cover C.

Figure 6:
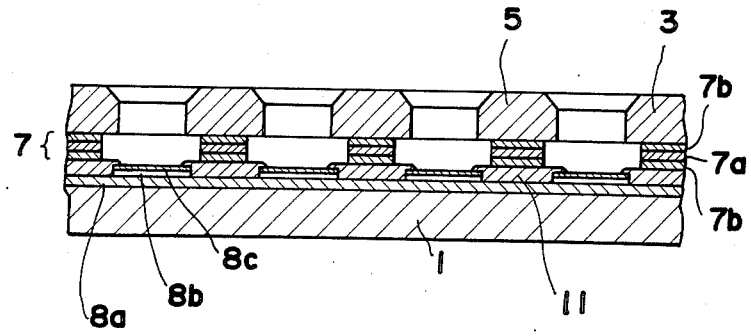
FIG. 6 is a sectional view showing details of the connecting terminal.

In FIG. 6, the flexible printed circuit board is shown as having a base film 8a on which is formed the printed patterns made of copper 8b. Gold platings 8c are carried on the printed patterns at those portions constituting the terminal contacts 2. The layers of bonding agent 7b, 7b are formed on both sides of the base 7a of the double faced bonding material 7. Numeral 11 designates the coverlay described earlier.

Figure 7:
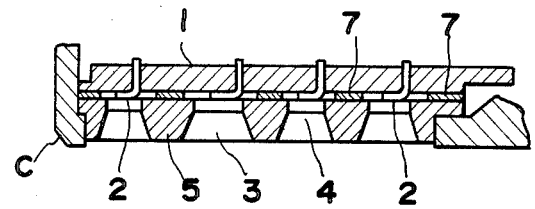
FIG. 7 is a sectional view of an electrical connecting terminal according to another embodiment of the present invention.
Figure 8:
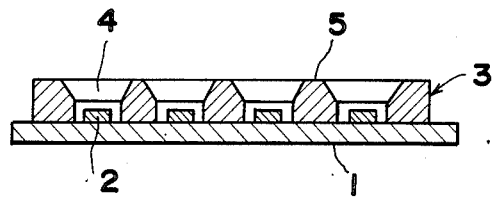
FIG. 8 is a sectional view of a prior art.

Referring to FIG. 7 showing an electrical connecting terminal according to another embodiment of the present invention, terminal contacts 2 are made of conductor pieces affixed to a substrate 1 which is in this case, made of a rigid electrical insulating material. The other elements shown in FIG. 7 have the same structure as those of FIG. 1 and like parts are designated by like numerals and an explanation for these parts is omitted here.

What is claimed is:

1. An electrical connecting terminal comprising:
   a substrate;
   a plurality of electrical contacts disposed on said substrate;
   a frame member having a plurality of apertures corresponding to said electrical contacts, and having wall portions in enclosing registry within individual apertures; and
   waterproof double faced bonding sheet means having a plurality of apertures corresponding to said apertures of said frame member and adhesive sheet portions corresponding to said wall portions so as to individually enclose said respective apertures, said sheet portions bonding said frame member to said substrate so that said wall portions and said sheet portions individually surround each electrical contact thereby providing a water resistant separation between said contacts.

2. An electrical connecting terminal as set forth in claim 1, wherein said waterproof double faced bonding sheet means includes a waterproof sheet and a waterproof bonding agent applied to both sides of said waterproof sheet.

3. An electrical connecting terminal as set forth in claim 1, wherein said waterproof double faced bonding sheet means is an adhesive sheet made of a waterproof bonding material.

4. An electrical connecting terminal as set forth in claim 3, wherein said adhesive sheet is thermosensitive so as to be bonded to said substrate and said frame member when heated.

5. An electrical connecting terminal as set forth in claim 1, wherein said substrate is a flexible printed circuit board having printed patterns, said electrical contacts being constituted by a portion of the respective printed patterns.

6. An electrical connecting terminal as set forth in claim 5, further comprising an electrically insulative coverlay covering said printed patterns except for said electrical contacts.

7. An electrical connecting terminal comprising:
   a substrate;
   a plurality of electrical contacts disposed on said substrate;
   a frame member having a plurality of apertures corresponding to said electrical contacts and having wall portions in enclosing registry with the individual apertures; and
   water-resistant double faced bonding sheet means having a plurality of apertures corresponding to said apertures of said frame member and adhesive sheet portions corresponding to said wall portions, so as to individually enclose said respective apertures, said sheet portions bonding said wall portions to said substrate so that said sheet portions surround each individual electrical contact thereby resisting the passage of water through gaps between said substrate and said wall portions.

8. An electrical connecting terminal as set forth in claim 7, wherein said water-resistant double faced bonding sheet means comprises a waterproof sheet and a rubber bonding agent applied to both sides of said waterproof sheet.

9. The method of producing an electrical connector including a substrate having a plurality of spaced contacts on a face thereof and a frame member affixed to said substrate and having peripherally closed openings therein registering with and providing access to respective contacts, said method comprising forming a bonding sheet having opposite adhesive or adhesive precursor faces with peripherally closed openings spaced similarly to said contacts and frame openings and sandwiching said bonding sheet between confronting faces of said substrate and frame member with respective contacts and openings in said frame member and bonding sheet in registry to provide a water resistant bond between said frame member and substrate.

10. The method of claim 9 wherein said bonding sheet includes separable protective plies on said opposite faces thereof and said protective plies are stripped from said bonding sheet before said bonding sheet is sandwiched between said substrate and frame member.

11. The method of claim 8 wherein said bonding sheet adhesive faces are heat sensitive and said bonding sheet is sandwiched between said frame member and substrate confronting faces under pressure while heating said adhesive faces.

12. An electrical connecting terminal comprising:

a substrate;
a plurality of electrical contacts disposed on said substrate;
a frame member having a plurality of apertures corresponding to said electrical contacts; and
a thermosensitive adhesive sheet formed of a waterproof bonding material, and sheet being sandwiched between and heat bonded to said substrate and said frame member and providing a water resistant separation between said electrical contacts.

13. The method of producting an electrical connector including a substrate having a plurality of spaced contacts on a face thereof and a frame member affixed to said substrate and having openings therein registering with and providing access to respective contacts, said method comprising forming a bonding sheet having opposite heat sensitive adhesive or heat sensitive adhesive precursor faces with openings spaced similarly to said contacts and frame openings and sandwiching said bonding sheet between confronting faces of said substrate and said frame member with respective contacts and openings in said frame member and bonding sheet in registry under pressure while heating said adhesive faces to provide a water resistant bond between said frame member and said substrate.

* * * * *